United States Patent [19]

Itoh et al.

[11] Patent Number: 5,102,498

[45] Date of Patent: Apr. 7, 1992

[54] METHOD OF WET ETCHING BY USE OF CARBONACEOUS MASKS

[75] Inventors: Kenji Itoh, Zama; Osamu Aoyagi, Atsugi, both of Japan

[73] Assignee: Semiconductor Energy Laboratory Co., Ltd., Kanagawa, Japan

[21] Appl. No.: 606,596

[22] Filed: Oct. 31, 1990

Related U.S. Application Data

[63] Continuation of Ser. No. 392,582, Aug. 11, 1989, Pat. No. 5,022,959.

[30] Foreign Application Priority Data

Aug. 23, 1988 [JP] Japan ............................ 63-209724

[51] Int. Cl.⁵ .................... H01L 21/306; B44C 1/22; C03C 15/00; C23F 1/02
[52] U.S. Cl. ......................... 156/659.1; 156/643; 156/653; 156/656; 156/657; 156/662; 156/904; 156/DIG. 68; 204/192.32; 252/79.1; 427/38
[58] Field of Search ............. 156/643, 646, 652, 653, 156/655, 656, 657, 659.1, 661.1, 662, 904, DIG. 68; 204/192.32, 192.35; 427/38, 39; 252/79.1

[56] References Cited

U.S. PATENT DOCUMENTS

| | | | |
|---|---|---|---|
| 4,053,350 | 10/1977 | Olsen et al. | 156/659.1 |
| 4,620,898 | 11/1986 | Banks et al. | 156/643 |
| 4,904,338 | 2/1990 | Kozicki | 156/628 |

Primary Examiner—William A. Powell
Attorney, Agent, or Firm—Sixbey, Friedman, Leedom & Ferguson

[57] ABSTRACT

It is proposed to widen the application of wet etching by making use of excellent masks. In advance of actually etching of the surface to be etched, the surface is coated with a patterned carbon coating as a mask by CVD. The carbon coating has a high degree of hardness comparable to that of diamond and has an excellent resistance to the attack of chemicals.

8 Claims, 2 Drawing Sheets

METHOD OF WET ETCHING BY USE OF CARBONACEOUS MASKS

This is a continuation application of Ser. No. 07/392,582, filed Aug. 11, 1989, now U.S. Pat. No. 5,022,959.

BACKGROUND OF THE INVENTION

This invention concerns improvements relating to the etching of thin films.

Along with the development of ULSI devices, high precision patterning technologies have been of great importance. There are two types of etching process for producing patterns. Dry etching is the method which is carried out with a gasesous etchant based largely on its phisical attack to surfaces to be etched rather than corrosive attack. Wet etching is representatively based on chemical corrosion of surfaces to be etched, for example, by means of acid. Since the former tends to give rise to damage of the surface due to the bombardment of excited species, some kinds of thin films can not be treated by this method if the surface underlying the thin films is made of a material which is vulnerable to the attack of the bombardment. The wet etching in turn has a shortcoming in that, when the underlying film to be patterned is made of a material which is not easily attached by chemicals but vulnerable to the bombardment, it is too difficult to select a corrosive etchant which is sufficiently corrosive to etch the film and a material for use in forming masks which has to endure the attack of the strong etchant.

SUMMARY OF THE INVENTION

It is therefore an object of the invention to provide an excellent wet etching method which can be used for a variety of types of film materials.

In order to accomplish the above and other objects the present invention proposes to form a carbon film on the surface to be etched and pattern the carbon film in order to form a carbon mask which is immune to the attack of chemicals.

According to a preferred embodiment of the present invention, the energy band gap of carbon mask is not lower than 1.0 eV, preferably 1.5 to 5.5 eV: the Vickers hardness is not lower than 2000 $Kg/mm^2$, preferably not lower than 4500 $Kg/mm^2$ at the external surface of carbon coatings.

DETAILED DESCRIPTION OF THE PREFERRED EMBODIMENTS

Figure 1:
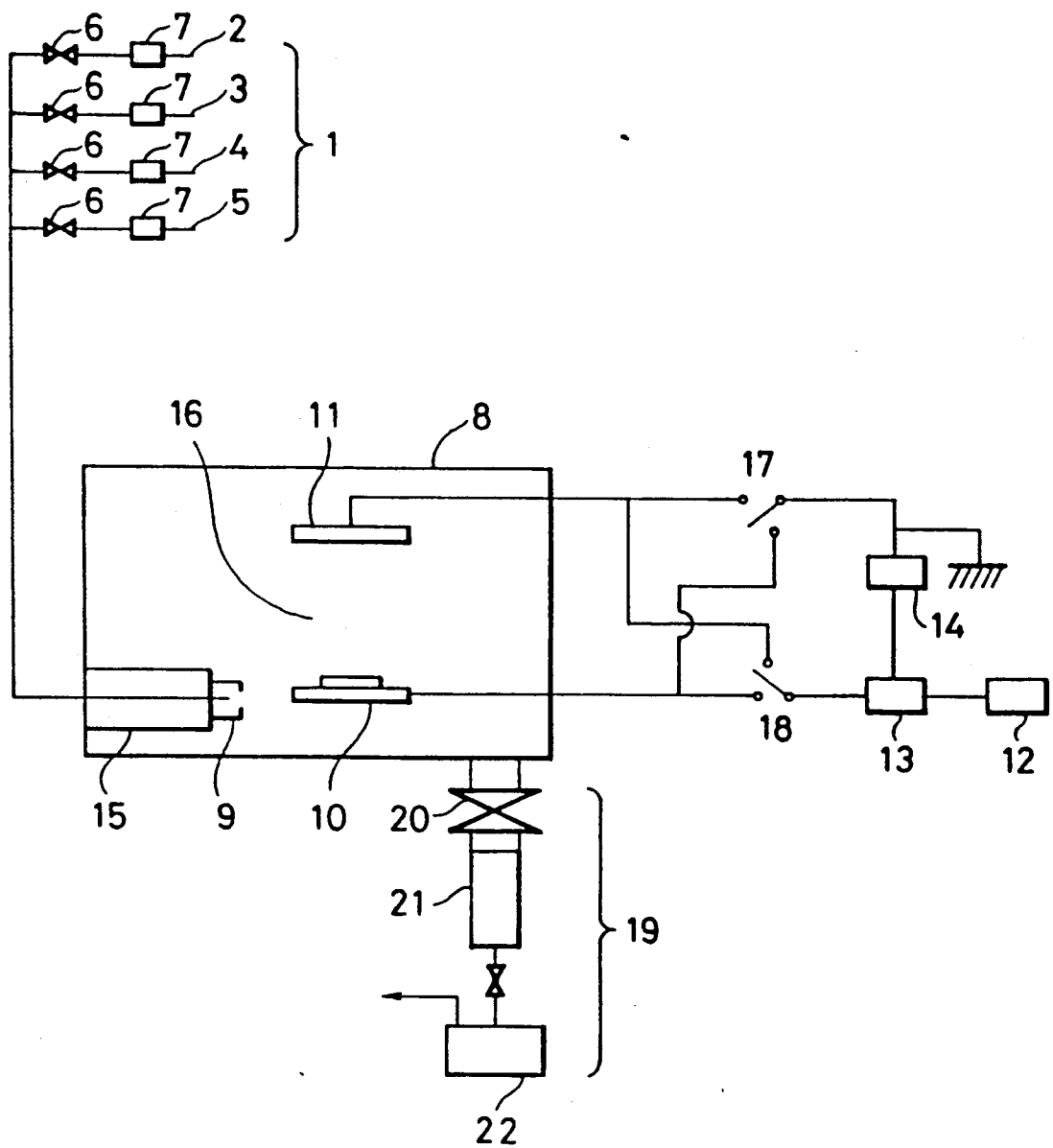
FIG. 1 is a schematic diagram showing a CVD apparatus in accordance with the present invention.

Referring to FIG. 1, there is schematically shown therein a plasma CVD apparatus for depositing carbon material on a surface in accordance with the teaching of the present invention. The surface to be coated may for example be made of semiconductor material, glass, metal, ceramics, organic resins, magnetic substance and so forth.

The apparatus comprises a reaction chamber 8 defining a reaction space 16 therein, first and second electrodes 10 and 11, a high frequency electric power source 12 for supplying electric energy through a matching transformer 13, a DC bias source 14 connected in series between the electrodes 10 and 11, a gas supply system 1 consisting of four gas supply passages each of which is provided with a flow meter 7 and a valve 6, a microwave energy supply 15 for exciting gases from the supply system 1 by injection of microwave energy, a nozzle 9 through which gas excited by the microwave energy supply 15 is introduced into the reaction space 16, and an exhaust system 19 including a pressure control valve 20, a turbomolecular pump 21 and a rotary pump 22. The electrodes are designed such that (the area of the first electrode 10)/(the area of the second electrode 11)<1. The polalities of the electrodes 10 and 11 can be exchanged by means of switches 17 and 18.

In operation of this apparatus, a carrier gas of hydrogen is introduced to the reaction space 20 from the gas supply passage 2 together with a reactive gas comprising a hydrocarbon such as methane or ethylene supplied from the gas supply passage 3. The gas introduction rates of the hydrogen and the hydrocarbon gas are equal. Pre-excitation may be effected by the microwave energy supply 15. The pressure in the reaction space is maintained within the range between 0.001 to 10 Torr, preferably 0.01 to 0.5 Torr, e.g. 0.015 Torr. High frequency electric energy at a frequency not lower than 1 GHz, preferably 2.45 GHz, is applied to the reactive gas at a power level of from 0.1 to 5 kilo-Watt for breaking C—H bonds. When the frequency is selected to be from 0.1 to 50 MHz, C=C bonds can be broken and transformed to —C—C— bonds. By virtue of this reaction, carbon atoms are deposited in the form of a structure in which the diamond structure occurs at least locally.

A bias voltage of, for example, −200 to 600 V is set at the DC bias source 15. The effective bias voltage level is substantially −400 to +400 V in virtue of the fact that a self bias level of −200 V is spontaneously applied between the electrodes 11 and 12 with the bias voltage level of the source 15 being zero.

Generally, the high frequency input power is chosen to be between 10 Watts and 5 kilo-Watt, preferably between 50 Watts and 1 kilo-Watt, e.g. 60 W. This input power corresponds to 0.03 to 3 $Watt/cm^2$ in terms of plasma energy.

Carbon films of 2000 Å thickness were deposited on Si wafers and dipped in several etchants. When the carbon film is dipped in a 50% hydrofluoric acid for 25 minutes, no corrosion was observed. When dipped in a 100% phosphorous acid for 10 minutes, no corrosion was also observed. When dipped in the mixture of a 50% hydrofluoric acid and a 100% nitric acid at 1:1 ratio, the temperature was elevated due to reaction heat but no corrosion of the carbon film was observed, while the Si wafer was partially corroded after dipping for 5 minutes. Also, after dipped in hydrazine for 30 minutes, no corrosion of the carbon film was observed while the underlying Si wafer was partially corroded. These experiments mean that the carbon films formed in accordance with the above procedure can be very excellent masks suitable for wet etching with strong chemicals.

After completing the formation of the carbon films on surfaces to be etched, patterned organic masks are coated over the films and then the films are returned to the appropriate position in the chamber followed by the introduction of an etchant gas. The etchant gas may for example be $O_2$, air, $NO_2$, NO, $N_2O$, a mixture of oxygen and hydrogen, or another suitable oxygen compound. A plasma is generated in the same manner as in the deposition process above-described and results in etching of the carbon film. Preferably, the substrate temperature is maintained at from 100° to −100° C. during etching. The pressure of the reactive gas is 0.01 to 1 Torr.

Figure 2:
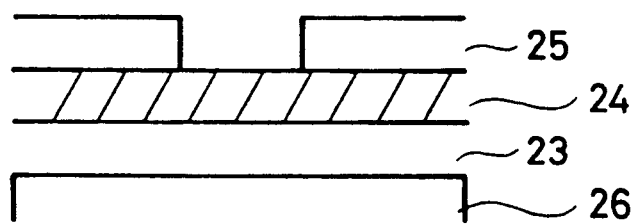
FIGS. 2(A) to 2(E) are cross sectional schematics showing the etching process in accordance with the present invention.
Figure 2:
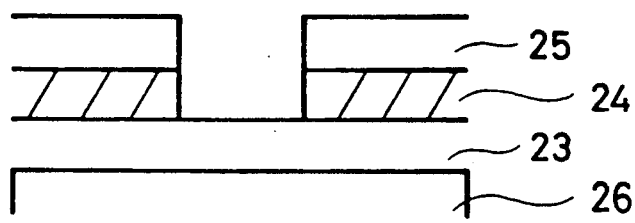
Figure 2:
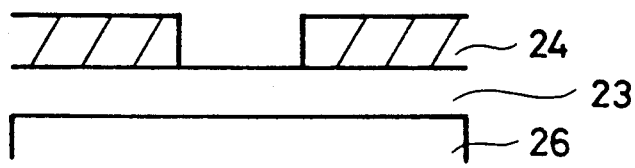
Figure 2:
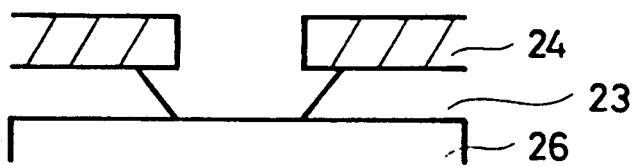
Figure 2:
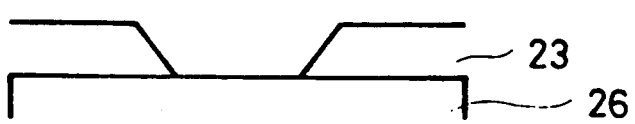

An exemplary etching process will be now described in conjunction with FIGS. 2(A) to 2(E). On a glass substrate 26 is a composite film 23 to be etched. The composite film 23 comprises a metal layer of 1 micrometer thick, a silicon nitride layer of 1 micrometer and an amorphous silicon layer stacked in this order on the glass substrate. A carbon film 24 is deposited on the film 23 in accordance with the above description followed by the formation of a patterned mask 25 of photoresist as shown in FIG. 2(A). The carbon film 24 is partially removed through the mask 25 by the etching process in accordance with the above description to produce the pattern of the carbon film followed by the removal of the organic mask 25 as shown in FIGS. 2(B) and 2(C). This etching process is carried out with the substrate 26 placed on the first electrode 10 which is supplied with AC energy while the second electrode 11 is grounded. After removing the substrate from the chamber, the film to be etched is subjected to wet etching with the patterned carbon film 24 as the mask and partially removed as shown in FIG. 2(D). Finally, the substrate is returned into the chamber and the patterned carbon film 24 is removed by the etching process. In this removal procedure of the patterned carbon film 24, the switches 17 and 18 are turned so that the substrate to be processed is ground in order to make the effect of the etching chemical rather than phisical.

While a description has been made for several embodiments, the present invention should be limited only by the appended claims and should not be limited by the particualr examles, and there may be caused to artisan some modifications and variation according to the invention.

The types of carbon coatings deposited in accordance with the present invention includes amorphous, polycrystals (comprising diamond powders), diamond films. In the case of a dual film, lower and upper films may be, respectively, amorphous and amorphous (having different hardnesses), amorphous and polycrystals, polycrystals and polycrystals, or polycrystals and a diamond film.

We claim:

1. A method for wet etching a film carried on a substrate to produce a predetermined pattern in the film comprising the steps of:
    coating a surface of the film to be patterned on the substrate with a carbonaceous film comprising one of an amorphous carbon, poly-crystalline carbon and diamond by virtue of a chemical vapor deposition method in a reaction chamber;
    coating a first mask selectively on portions of said carbon film in accordance with a predetermined pattern;
    dry etching the portions of said carbon film not covered by said first mask in order to form a second mask of said carbon film in accordance with said predetermined pattern by the use of a gaseous etchant;
    wet etching the film to be patterned in the areas not covered by the carbon film to produce said predetermined pattern in said film.

2. The method according to claim 1 wherein said first mask is an organic resin.

3. The method according to claim 1 wherein said carbon film is a dual film comprising one of amorphous-amorphous, amorphous-polycrystal, polycrystal-polycrystal and polycrystal-diamond.

4. The method of claim 1 wherein the etchant gas comprises one of $O_2$, air $NO_2$, NO, $N_2O$ and hydrogen.

5. The method of claim 1 wherein the substrate is maintained at a temperature of −100° to 100° C. during etching.

6. The method of claim 1 wherein the wet etchant comprises one of hydrofluoric acid, phosphorous acid, a mixture of hydrofluoric acid and nitric acid, and hydrozine.

7. The method of claim 1 wherein the film carried on the substrate comprises silicon nitride.

8. A method for wet etching a film carried on a substrate comprising the steps of:
    covering a portion of the film with a mask; and
    wet etching the film in the area not covered by the mask in order to pattern the film,
    wherein said mask comprises amorphous carbon, poly-crystalline carbon, or diamond.

* * * * *